United States Patent
Mouri et al.

(10) Patent No.: US 6,659,111 B1
(45) Date of Patent: Dec. 9, 2003

(54) CLEANING GAS AND METHOD FOR CLEANING VACUUM TREATMENT APPARATUS BY FLOWING THE CLEANING GAS

(75) Inventors: Isamu Mouri, Saitama (JP); Tetsuya Tamura, Saitama (JP); Mitsuya Ohashi, Saitama (JP); Tadayuki Kawashima, Saitama (JP); Masahiko Matsudo, Yamanashi (JP); Tatsuo Hatano, Yamanashi (JP)

(73) Assignees: Central Glass Company, Limited, Ube (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/480,680

(22) Filed: Jan. 11, 2000

(30) Foreign Application Priority Data

Jan. 12, 1999 (JP) .......................... 11-004810
Feb. 9, 1999 (JP) .......................... 11-030782
Oct. 25, 1999 (JP) .......................... 11-302715

(51) Int. Cl.$^7$ .............................................. B08B 9/00
(52) U.S. Cl. .......................... 134/22.1; 134/2; 134/11; 134/22.18; 134/25.1; 134/26; 134/30; 134/31; 438/905
(58) Field of Search ..................... 134/2, 22.1, 25.1, 134/11, 42, 1.1; 216/75, 63, 67; 438/706, 906

(56) References Cited

U.S. PATENT DOCUMENTS 4,915,777 A * 4/1990 Jucha et al. ............... 252/79.1
5,534,072 A * 7/1996 Mizuno et al. ............. 118/728
5,565,038 A * 10/1996 Ashley ........................ 134/2
6,082,375 A * 7/2000 Gealy et al. ................ 134/1.1
6,095,158 A * 8/2000 Shugrue ...................... 134/1
6,127,271 A * 10/2000 Turlot et al. ............... 438/690
6,147,006 A * 11/2000 Mouri et al. ............... 438/706
6,164,295 A * 12/2000 Ui et al. ..................... 134/1.1
6,221,168 B1 * 4/2001 Carter et al. ................ 134/1
6,274,507 B1 * 8/2001 Narita et al. ............... 438/758

FOREIGN PATENT DOCUMENTS

JP 4366196 12/1992
JP 8-295600 11/1996
JP 9129586 5/1997

OTHER PUBLICATIONS

A. Grill. Cold plasma in materials fabrication. 1994. IEEE Press, ISBN 0–7803–1055–1. pp. 110–111.*

* cited by examiner

Primary Examiner—Randy Gulakowski
Assistant Examiner—M. Kornakov
(74) Attorney, Agent, or Firm—Crowell & Moring LLP

(57) ABSTRACT

A cleaning gas includes HF gas whose concentration is greater than or equal to 1 vol % and oxygen containing gas whose concentration ranges from 0.5 to 99 vol %. The oxygen containing gas includes at least one of $O_2$ gas, $O_3$ gas, $N_2O$ gas, NO gas, CO gas and $CO_2$ gas. The cleaning gas is employed to remove a deposited material generated in a vacuum treatment apparatus for producing a thin film of at least one of Ti, W, Ta, Ru, Ir, a compound thereof and an alloy thereof.

11 Claims, 2 Drawing Sheets

CLEANING GAS AND METHOD FOR CLEANING VACUUM TREATMENT APPARATUS BY FLOWING THE CLEANING GAS

BACKGROUND OF THE INVENTION

The present invention relates to a cleaning gas for removing an unnecessary deposit deposited on an inner wall and tools of a thin film producing apparatus by means of CVD method, and relates to a method for cleaning a vacuum treatment apparatus by the cleaning gas.

In various production processes for producing thin-film devices, optical devices and super steel materials, various films, powders and whiskers are produced by means of CVD method, sputtering method, sol-gel method and vapor deposition method. By the execution of the above-mentioned methods, unnecessary depositions are deposited on an inner wall and tools of the producing apparatus. In order to prevent such unnecessary deposit from affecting objective products, it is necessary to properly remove such unnecessary deposit. A cleaning gas employed to remove such unnecessary deposit is required to have several performances. For example, such a cleaning gas has to perform so as not to damage the objective products, not to increase the amount of particles in a reactor of the apparatus, to be easily varied into innocent gas and to tenderly affect the earth.

Presently, a plasma cleaning employing a cleaning gas of at least one of $C_2F_6$, $CF_4$, $C_4F_8$, $NF_3$ and $ClF_3$ and a plasma-less cleaning employing a cleaning gas of at least one of $F_2$, $Cl_2$ and $ClF_3$ have practically been executed to remove unnecessary deposits. However, these methods have several problems such that when the cleaning is executed by using the above-mentioned fluorine series gas, heat-resisting Ni-alloy, stainless steel and AlN are corroded by the gas and particles are increased in the apparatus, and that if the temperature for cleaning is lowered to suppress such corrosion, an idling time thereof is increased to lower the throughput of the apparatus, and that if the temperature for the cleaning is lowered to prevent the corrosion of the material of the apparatus, the cleaning speed is lowered.

A Japanese Patent Provisional Publication No. 8-295600 discloses a method for cleaning a nickel base plate employed to produce whiskers of TiC, TiCO and TiCN by means of diluted nitric acid. However, this method requires executing a wet cleaning in an in-site cleaning, and therefore it becomes difficult to improve the throughput of the apparatus.

SUMMARY OF THE INVENTION

It is therefore an object of the present invention to provide an improved cleaning gas which effectively removes unnecessary deposit deposited in a vacuum treatment apparatus while satisfying performances required to such a cleaning gas.

A aspect of the present invention resides in a cleaning gas for removing a deposited material generated in a vacuum treatment apparatus for forming a thin film of at least one of Ti, W, Ta, Ru, Ir, a compound including one of Ti, W, Ta, Ru and Ir and an alloy including one of Ti, W, Ta, Ru and Ir, the cleaning gas comprises HF gas and oxygen containing gas.

Another aspect of the present invention resides in a method which functions to remove a deposited material generated in a vacuum treatment apparatus for forming a thin film of at least one of Ti, W, Ta, Ru and Ir, a compound including one of Ti, W., Ta, Ru and Ir and an alloy including one of Ti, W, Ta, Ru and Ir. The method comprises a step of flowing a cleaning gas in the vacuum treatment apparatus.

DETAILED DESCRIPTION OF THE INVENTION

Figure 1:
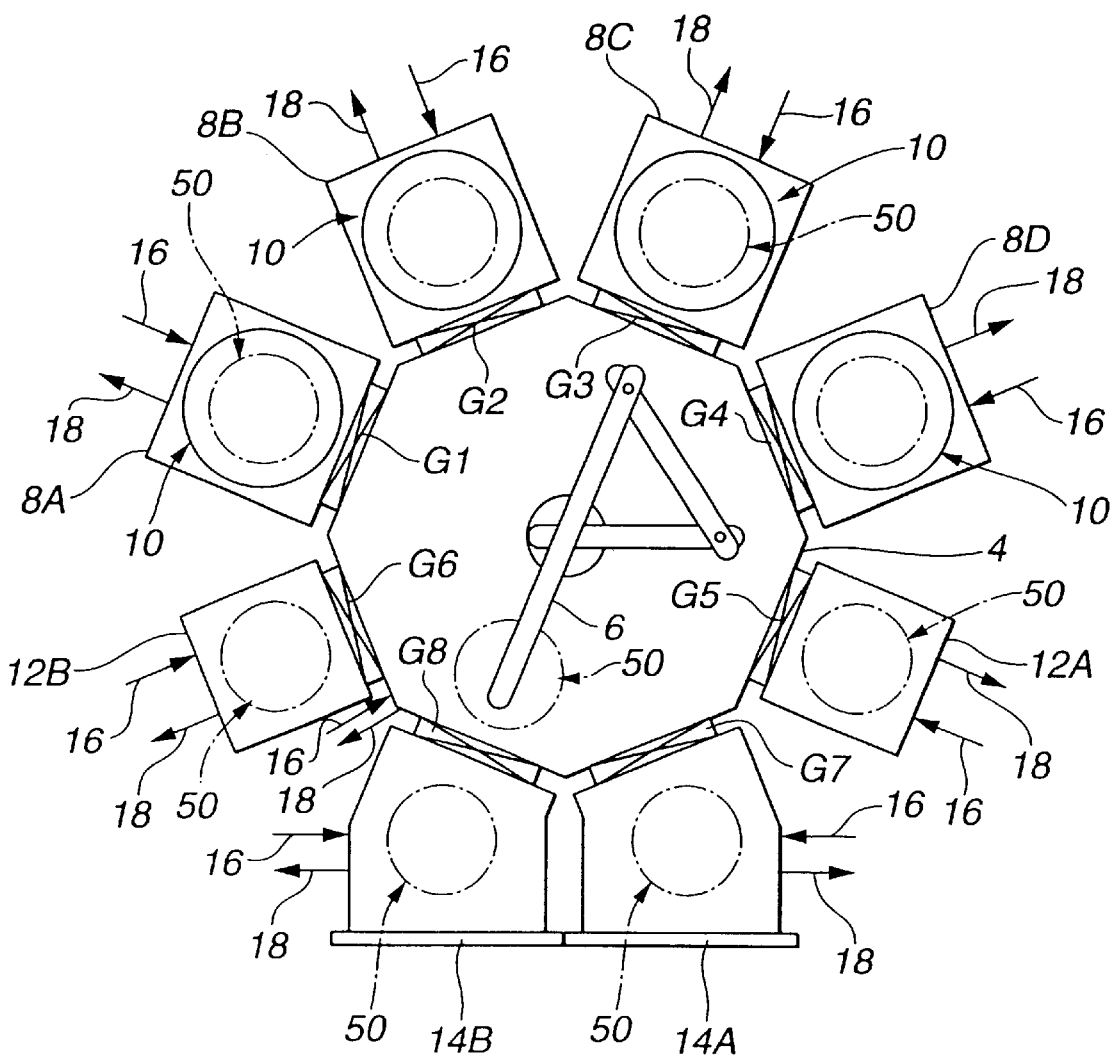
FIG. 1 is a plan view showing a thin film producing apparatus of a cluster tool type, to which a cleaning method according to the present invention is adapted.

As a result of intensive studies, the present inventors have found a composition of a cleaning gas by which unnecessary deposit deposited on an inner wall and tools of a film producing apparatus is efficiently and safety removed. More specifically, the cleaning gas according to the present invention functions to effectively remove unnecessary deposit deposited in a vacuum treatment apparatus for producing thin films of one of Ti, W, Ta, Ru and Ir, and of a compound of one of Ti, W, Ta, Ru and Ir, and alloy of one of Ti, W, Ta, Ru and Ir. The cleaning gas is a mixed gas containing a HF gas and an oxygen-containing gas. The concentration of the HF gas is greater than or equal to 1 vol %, and the concentration of the oxygen containing gas ranges from 0.5 to 99 vol %.

The oxygen containing gas employed in the cleaning gas according to the present invention comprises at least one of $O_2$ gas, $O_3$ gas, $N_2O$ gas, NO gas, CO gas and $CO_2$ gas.

The cleaning gas according to the present invention is applicable to the apparatus for making a thin film of one of Ti, W and Ta, a compound of one of Ti, W and Ta and an alloy of one of Ti, W and Ta. More specifically, Ti, W, Ta, an oxide of one of Ti, W and Ta, a nitride of one of Ti, W and Ta and an alloy of one of Ti, W and Ta. Furthermore, the cleaning gas is applicable to the apparatus for making a thin film of one of Ti, TiN, TiW, TiON, W, WN, TaN, Ru, Ir, compound thereof and alloy thereof. The cleaning gas simultaneously removes CVD reaction by-product produced at piping with by-product produced in the chamber of the apparatus.

It is preferable that the concentration of the HF gas of the cleaning gas is greater than or equal to 1 vol % and the concentration of the oxygen containing gas of the cleaning gas is within a range from 0.5 to 99 vol %. More preferably, the concentration of HF gas is greater than or equal to 10 vol % and the concentration of the oxygen containing gas is within a range from 1 to 90 vol %. If the concentration of HF gas is smaller than 1 vol % and the concentration of oxygen containing gas is smaller than 0.5 vol %, it is difficult to ensure a preferable etching speed. Specifically, when the concentration of oxygen containing gas is smaller than 0.5 vol %, the material of the apparatus is damaged by the cleaning gas in relatively large degree. Further, when the concentration of oxygen containing gas is greater than 1 vol %, an etching speed of the cleaning gas is accelerated. When the concentration of oxygen containing gas is greater than a range from 75 to 85 vol %, the etching speed tends to decrease in inverse proportion to the increase of the oxygen concentration. If the concentration of the oxygen containing gas is greater than 90 vol %, the etching speed is radically decreased.

In addition to the above-mentioned gases, inert gas such as $N_2$, Ar, He may be employed. Further, the other gas having an oxidation property may be employed.

Next, as to the pressure during the cleaning operation employing the cleaning gas according to the present invention, it is necessary that the whole pressure, which is the sum of the HF gas partial pressure and the oxygen containing gas partial pressure, is smaller than or equal to 500 Torr. Preferably, the whole pressure should be smaller than or equal to 100 Torr, and it is further preferable that the pressure is within a range 0.1 to 10 Torr.

If the whole pressure becomes greater than 500 Torr, the evaluating time necessary for evacuating the cleaning gas becomes large. Further, even if a mixture ratio of the mixed gas is within an allowable range and if the partial pressure of the oxygen containing gas is smaller than or equal to 0.005 Torr, it is difficult to ensure a preferable etching speed, and the amount of particles in the reactor is increased without improving the corrosion resistance of the material of the apparatus.

As a result of further intensive studies, the inventors of the present invention have found that the corrosion resistance of the material employed in the apparatus. is remarkably improved by adding oxygen containing gas to HF gas. More specifically, the cleaning gas according to the present invention is applicable to (1) Al and Al-alloy such as Al5052 and Al6061 (JIS mark) at a temperature range not larger than 600° C., (2) heat-resisting Ni-alloy at a temperature range not larger than 450° C., (3) austenitic stainless steels at a temperature range of 450° C., (4) ferritic stainless steels at a temperature range of 460° C., (5) aluminum nitride at a temperature range not larger than 700° C., (6) aluminum oxide at a temperature range not larger than 920° C., (7) quartz at a temperature range not larger than 700° C., (8) silicon nitride at a temperature range of 760° C. and (9) silicon carbide at a temperature range of 680° C. That is, the cleaning temperature may be determined according to the employed material.

The present invention will be explained in detail with reference to the following examples. It will be understood that the present invention is not limited to these examples.

EXAMPLES 1 TO 14, COMPARATIVE EXAMPLES 1 AND 2

As to a sample produced by forming a Ti film of 1 $\mu$m thick on a silicon wafer, measurements of etching speed thereto under conditions shown in Table 1 were executed. The results thereof are also shown in Table 1. As is clearly shown in Table 1, the etching speed was remarkably improved by adding a trace quantity of $O_2$ gas. Also, when the $O_2$ gas had been changed to one of $O_3$, $N_2O$, NO, CO and $CO_2$, the etching speed was similarly improved.

TABLE 1

| | Temperature (° C.) | Gas flow amount (SCCM) | Gas concentration (vol %) | Pressure (Torr) | Etching speed (Å/min) |
|---|---|---|---|---|---|
| Comparative Example 1 | 500 | HF:1000 | HF:100 | 5 | 103 |
| Example 1 | 500 | HF:1000 O2:5 | HF:99.5 O2:0.5 | 5 | 298 |
| Example 2 | 500 | HF:1000 O2:10 | HF:99 O2:1 | 5 | 1660 |
| Example 3 | 500 | HF:1000 O2:100 | HF:90.9 O2:9.1 | 5 | 8710 |
| Example 4 | 500 | HF:300 O2:50 | HF:85.7 O2:14.3 | 5 | 2490 |
| Example 5 | 500 | HF:1000 O2:1000 | HF:50 O2:50 | 5 | 10340 |

TABLE 1-continued

| | Temperature (° C.) | Gas flow amount (SCCM) | Gas concentration (vol %) | Pressure (Torr) | Etching speed (Å/min) |
|---|---|---|---|---|---|
| Example 6 | 500 | HF:1000 O2:1500 | HF:40 O2:60 | 5 | 10305 |
| Example 7 | 500 | HF:1000 O2:2000 | HF:33.3 O2:66.7 | 5 | 10426 |
| Example 8 | 500 | HF:1000 O2:3000 | HF:25 O2:75 | 5 | 10319 |
| Example 9 | 500 | HF:1000 O2:4000 | HF:20 O2:80 | 5 | 10229 |
| Example 10 | 500 | HF:1000 O2:7000 | HF:12.5 O2:87.5 | 5 | 9875 |
| Example 11 | 500 | HF:500 O2:4500 | HF:10 O2:90 | 5 | 8136 |
| Example 12 | 500 | HF:10 O2:990 | HF:1 O2:99 | 5 | 238 |
| Comparative Example 2 | 500 | HF:5 O2:995 | HF:0.5 O2:99;5 | 5 | 99.4 |
| Example 13 | 600 | HF:1000 O2:100 | HF:90.9 O2:9.1 | 5 | 11900 |
| Example 14 | 700 | HF:1000 O2:100 | HF:90.9 O2:9.1 | 5 | 13810 |

EXAMPLES 15 TO 22, COMPARATIVE EXAMPLES 3 AND 4

As to a sample produced by forming a TiN film of 1 $\mu$m thick on a silicon wafer, measurements of etching speed thereto under conditions shown in Table 2 were executed. The results thereof are also shown in Table 2. As is clearly shown in Table 2, the etching speed was remarkably improved by adding a trace quantity of $O_2$ gas. Also, when the $O_2$ gas had been changed to one of $O_3$, $N_2O$, NO, CO and $CO_2$, the etching speed was similarly improved.

TABLE 2

| | Temperature (° C.) | Gas flow amount (SCCM) | Gas concentration (vol %) | Pressure (Torr) | Etching speed (Å/min) |
|---|---|---|---|---|---|
| Comparative Example 3 | 500 | HF:1000 | HF:100 | 5 | 8.5 |
| Example 15 | 500 | HF:1000 O2:5 | HF:99.5 O2:0.5 | 5 | 926 |
| Example 16 | 500 | HF:1000 O2:10 | HF:99 O2:1 | 5 | 1400 |
| Example 17 | 500 | HF:1000 O2:100 | HF:90.9 O2:9.1 | 5 | 1760 |
| Example 18 | 500 | HF:1000 O2:1000 | HF:50 O2:50 | 5 | 2500 |
| Example 19 | 500 | HF:500 O2:4500 | HF:10 O2:90 | 5 | 1120 |
| Example 20 | 500 | HF:10 O2:990 | HF:1 O2:99 | 5 | 238 |
| Comparative Example 4 | 500 | HF:5 O2:995 | HF:0.5 O2:99.5 | 5 | 140 |
| Example 21 | 600 | HF:1000 O2:100 | HF:90.9 O2:9.1 | 5 | 4300 |
| Example 22 | 700 | HF:1000 O2:100 | HF:90.9 O2:9.1 | 5 | 8200 |

EXAMPLES 23 TO 24, COMPARATIVE EXAMPLE 5

As to a sample produced by forming a W film of 1 $\mu$m thick on a silicon wafer, measurements of etching speed thereto under conditions shown in Table 3 were executed. The results thereof are also shown in Table 3. As is clearly shown in Table 3, the etching speed was remarkably improved by adding a trace quantity of $O_2$ gas. Also, when the $O_2$ gas had been changed to one of $O_3$, $N_2O$, NO, CO and $CO_2$, the etching speed was similarly improved.

TABLE 3

| | Temperature (° C.) | Gas flow amount (SCCM) | Gas concentration (vol %) | Pressure (Torr) | Etching speed (Å/min) |
|---|---|---|---|---|---|
| Comparative Example 5 | 500 | HF:1000 | HF:100 | 5 | ≦1 |
| Example 23 | 500 | HF:1000 O2:10 | HF:99 O2:1 | 5 | 1800 |
| Example 24 | 500 | HF:1000 O2:10 | HF:90.9 O2:9.1 | 5 | 2870 |

EXAMPLE 25

As to a sample produced by forming a WN film of 1 μm thick on a silicon wafer, measurements of etching speed thereto under a condition that a temperature is 500° C., HF gas flow rate is 900 SCCM (90%), $O_2$ gas flow rate is 100 SCCM (10%). As a result, the lo etching speed was 3045 Å/min which is very high in etching speed. When $O_2$ gas had not been added, the etching speed was smaller than or equal to a measurement lower limit (≦1 Å/min).

It has not been confirmed of the damages of the apparatus due to the operations for examples 1 to 25.

EXAMPLES 26 TO 36, COMPARATIVE EXAMPLES 6 TO 16

As to Al, Al-alloy 5052 (JIS mark), Al-alloy 6061 (JIS mark), heat-resisting Ni-alloy (trade name: Hastelloy C-22), ferroalloy SUS316L (JIS mark), SUS304 (JIS mark), SUS430L (JIS mark), AlN, $Al_2O_3$, $Si_3N_4$, $SiO_2$, corrosion characteristics by gas were observed. More specifically, HF gas (flow rate: 1000 SCCM) and a mixed gas of HF gas (flow rate: 100 SCCM) and $N_2O$ gas (flow rate: 10 SCCM) were used. The examples were exposed to the gas under a pressure of 500 Torr for 5 hours. After the exposure, the surface of each example was observed by an electron microscope, and the change of weights of each sample before and after the exposure was measured. As a result, it was found that damages to the material were remarkably decreased by adding $N_2O$ gas. Further, the etching speed of each of the examples 26 to 36 was very high as same as those of the examples 1 to 25. Comparative examples 6 to 16 show the results obtained by the experiments using only HF gas. Also when the gas $N_2O$ had been changed to one of $O_2$, $O_3$, NO, CO and $CO_2$, the etching speed of this example was high as is similar to those of the examples 1 to 25.

TABLE 4

| | Material (JIS mark) | Temperature (° C.) | Observation result |
|---|---|---|---|
| Comparative Example 6 | Al | 400 | White thick film was deposited and the film was cracked (Comparative example 6 to 8) |
| Comparative Example 7 | Al5052 | 400 | |
| Comparative Example 8 | Al6061 | 400 | |
| Comparative Example 9 | Heat-resisting Ni alloy | 400 | Surface of each comparative examples 9 to 12 was turned to yellow or black and was cracked. |
| Comparative Example 10 | SUS316 | 400 | |
| Comparative Example 11 | SUS304 | 400 | |
| Comparative Example 12 | SUS430 | 450 | |
| Comparative Example 13 | AlN | 700 | Corrosive particulates were generated on the surface of each comparative examples 13–14. |
| Comparative Example 14 | Al2O3 | 900 | |
| Comparative Example 15 | SiO2 | 700 | The surface of each comparative example was etched to lose transparency, and the weight thereof was decreased by the etching. |
| Comparative Example 16 | Si3N4 | 700 | |
| Example 26 | Al | 600 | Semitransparent film was produced on the surface of each comparative example 26–32 and was in a passive state. Therefore, no corrosion was occurred. |
| Example 27 | Al5052 | 600 | |
| Example 28 | Al6061 | 600 | |
| Example 29 | Heat-resisting Ni alloy | 450 | |
| Example 30 | SUS316 | 450 | |
| Example 31 | SUS304 | 450 | |
| Example 32 | SU5430 | 460 | |
| Example 33 | AlN | 700 | The weight and surface condition of each example 33 to 35 were not substantially changed as corrpared with those of each example before treatment. |
| Example 34 | Al2O3 | 900 | |
| Example 35 | SiO2 | 700 | |
| Example 36 | Si3N4 | 760 | A semitransparent film was formed on the surface of the example 36. The surface was smooth and had no corrosion. Si-O bonding was observed as a result of the analysis of ESCA. It is thought that an oxide film superior in corrosion was formed on the surface. |

COMPARATIVE EXAMPLE 17

The heat-resisting Ni-alloy (trade name: astelloy C-22) was exposed to the mixed gas of HF gas (flow rate: 1000 SCCM) and $O_2$ gas (flow rate: 1000 SCCM) at temperature 450° C. and under pressure 760 Torr for 5 hours As a result, the surface of the comparative example 17 was turned to yellow, and corrosive particles were generated.

EXAMPLE 37

The heat-resisting Ni-alloy (trade name: Hastelloy C-22) was exposed to the mixed gas of HF gas (flow rate: 1000 SCCM) and $O_2$ gas (flow rate: 1000 SCCM) at a temperature of 450° C. and under a pressure of 500 Torr for 40 hours. As a result, a transparent passive film was formed on the surface of the example 37. The film was extremely thin and smooth. No corrosion was found on the surface.

COMPARATIVE EXAMPLE 18

The heat-resisting Ni-alloy (trade name: Hastelloy C-22) was exposed to the mixed gas of HF gas (flow rate: 990 SCCM) and $O_2$ gas (flow rate: 10 SCCM) at a temperature of 450° C. and under a pressure of 0.05 Torr for 40 hours. As a result, the surface of the comparative example 17 was turned to yellow and corroded. By an electron microscope, it was found that projecting substance and particulate material are generated on the surface of the comparative example 18. As a result of XMA observation, it was found that the particles produced on the surface of the comparative example 18 was a metal such as Fe and Ni and F.

COMPARATIVE EXAMPLE 19

An example obtained by forming TiW film of 1 μm thick on a silicon wafer was heated at 500° C., and HF gas (100%, flow rate: 1000 SCCM) was flowed in the reactor for 1 hour. Thereafter, the example was analyzed as to Ti and W by means of an X-ray fluorescence analyzer. As a result, Ti and W were remained on the wafer surface.

EXAMPLE 38

An example obtained by forming TiW film of 1 μm thick on a silicon wafer was heated at 500° C., and the mixed gas of HF gas (flow rate: 1000 SCCM) and $O_2$ gas (flow rate: 1000 SCCM) was flowed in the reactor for 1 hour. Thereafter, the example was analyzed as to Ti and W by means of an X-ray fluorescence analyzer. As a result, Ti and W were not detected on the wafer surface.

EXAMPLES 39 to 52,

COMPARATIVE EXAMPLES 20 to 21

As to a sample produced by forming a Ta film of 1 μm thick on a silicon wafer, measurements of etching speed thereto under conditions shown in Table 5 were executed. The results thereof are also shown in Table 5. As is clearly shown in Table 5, the etching speed was remarkably improved by adding a trace quantity of $O_2$ gas. Also, when the $O_2$ gas had been changed to one of $O_3$, $N_2O$, NO, CO and $CO_2$, the etching speed was similarly improved.

TABLE 5

| | Temperature (° C.) | Gas flow amount (SCCM) | Gas concentration (vol %) | Pressure (Torr) | Etching speed (Å/min) |
|---|---|---|---|---|---|
| Comparative Example 21 | 500 | HF:1000 | HF:100 | 5 | 29 |
| Example 39 | 500 | HF:1000 O2:5 | HF:99.5 O2:0.5 | 5 | 128 |
| Example 40 | 500 | HF:1000 O2:10 | HF:99 O2:1 | 5 | 460 |
| Example 41 | 500 | HF:1000 O2:100 | HF:90.9 O2:9.1 | 5 | 960 |
| Example 42 | 500 | HF:300 O2:50 | HF:85.7 O2:14.3 | 5 | 1340 |
| Example 43 | 500 | HF:1000 O2:1000 | HF:50 O2:50 | 5 | 6960 |
| Example 44 | 500 | HF:1000 O2:1500 | HF:40 O2:60 | 5 | 7342 |
| Example 45 | 500 | HF:1000 O2:2000 | HF:33.3 O2:66.7 | 5 | 7132 |
| Example 46 | 500 | HF:1000 O2:3000 | HF:25 O2:75 | 5 | 7369 |
| Example 47 | 500 | HF:1000 O2:4000 | HF:20 O2:80 | 5 | 7089 |
| Example 48 | 500 | HF:1000 O2:7000 | HF:12.5 O2:87.5 | 5 | 4958 |
| Example 49 | 500 | HF:500 O2:4500 | HF:10 O2:90 | 5 | 2685 |
| Example 50 | 500 | HF:10 O2:990 | HF:1 O2:99 | 5 | 265 |
| Comparative Example 22 | 500 | HF:5 O2:995 | HF:0.5 O2:99.5 | 5 | 32.2 |
| Example 51 | 600 | HF:1000 O2:100 | HF:90.9 O2:9.1 | 5 | 8872 |
| Example 52 | 700 | HF:1000 O2:100 | HF:90.9 O2:9.1 | 5 | 9810 |

EXAMPLES 53 to 60, COMPARATIVE EXAMPLES 22 and 23

As to a sample produced by forming a TaN film of 1 μm thick on a silicon wafer, measurements of etching speed thereto under conditions shown in Table 6 were executed. The results thereof are also shown in Table 6. As is clearly shown in Table 6, the etching speed was remarkably improved by adding a trace quantity of $O_2$ gas. Also, when the $O_2$ gas had been changed to one of $O_3$, $N_2O$, NO, CO and $CO_2$, the etching speed was similarly improved.

TABLE 6

| | Temperature (° C.) | Gas flow amount (SCCM) | Gas concentration (vol %) | Pressure (Torr) | Etching speed (Å/min) |
|---|---|---|---|---|---|
| Comparative Example 23 | 500 | HF:1000 | HF:100 | 5 | 0.5 |
| Example 53 | 500 | HF:1000 O2:5 | HF:99.5 O2:0.5 | 5 | 54 |
| Example 54 | 500 | HF:1000 O2:10 | HF:99 O2:1 | 5 | 258 |
| Example 55 | 500 | HF:1000 O2:100 | HF:90.9 O2:9.1 | 5 | 1692 |
| Example 56 | 500 | HF:1000 O2:1000 | HF:50 O2:50 | 5 | 1870 |
| Example 57 | 500 | HF:500 O2:4500 | HF:10 O2:90 | 5 | 380 |
| Example 58 | 500 | HF:10 O2:990 | HF:1 O2:99 | 5 | 93 |
| Comparative Example 24 | 500 | HF:5 O2:995 | HF:0.5 O2:99.5 | 5 | 28 |
| Example 59 | 600 | HF:1000 Q2:100 | HF:90.9 O2:9.1 | 5 | 2396 |
| Example 60 | 700 | HF:1000 O2:100 | HF:90.9 O2:9.1 | 5 | 3986 |

Next, a cleaning method for practically applying the above-mentioned gas to a vacuum treatment apparatus such as a thin film producing apparatus will be discussed.

Figure 2:
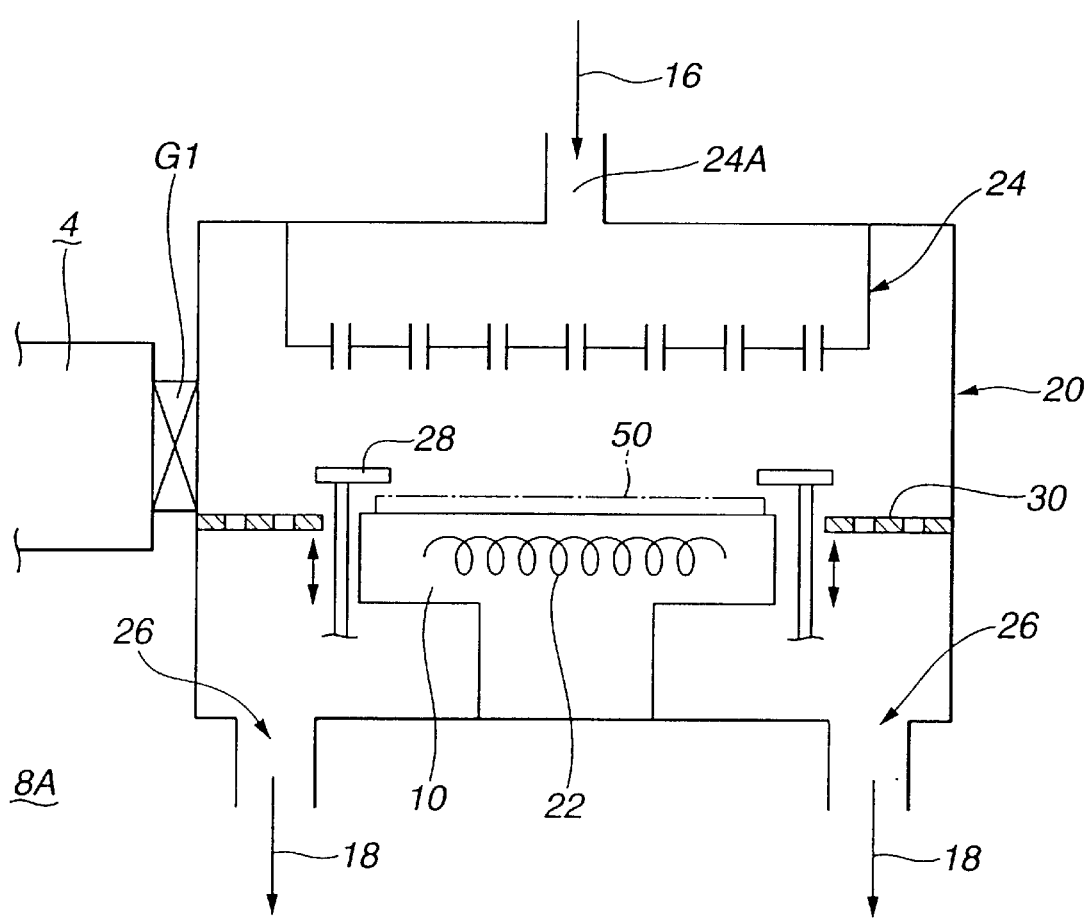
FIG. 2 is a schematic view showing one of the thin film producing apparatus.

FIGS. 1 and 2 show a thin film producing apparatus 2 of a cluster-tool type. The thin film producing apparatus 2 comprises a common conveying chamber 4 which has the form of octagon and is made of aluminum alloy. An articulated conveying arm 6 made of aluminum alloy is provided in the common conveying chamber 4 so as to be rotatable and expandable therein. A supporting portion for supporting a semiconductor wafer 50 to be treated is installed to a tip end of the articulated conveying arm 6. Four thin-film producing apparatuses 8A to 8D are connected to the common conveying chamber 4 through gate valves G1 to G4, respectively. A chamber 20 of each of the thin-film producing apparatuses 8A to 8D is made of aluminum alloy and includes a table 10 for setting the wafer 50 thereon, a clamp ring 28 for fixing the wafer 50 on the table 10, a shower head 24 for flowing gas and an attachment ring therein. The table 10 is made of aluminum alloy. Spare chambers 12A and 12B are connected to the common conveying chamber 4 through gate valves G5 and G6, respectively. The spare chambers 12A and 12B function as cooling chambers for cooling the treated wafer 50. Cassette chambers 14A and 14B for storing a plurality of the wafers 50 are connected to the common conveying chamber 4 through gate valves G7 and G8. It will be understood that a preheating chamber for preheating the wafer 50 before treatment may be provided as a spare chamber.

The thin-film producing apparatuses 8A to 8D, the common conveying chamber 4, the spare chambers 12A and 12B, and the cassette chambers 14A and 14B are independently connected to a gas supply line 16 for supplying treatment gas, inert gas such as $N_2$ gas and the cleaning gas according to the present invention and to a gas evacuating line 18 for evacuating an inner ambient thereof.

In the thin-film producing apparatuses 8A to 8D, thin films of Ti, W, Ta, Ru, Ir, the compound thereof and the alloy thereof are produced by the thermal CVD method. Further, the plasma CVD method is executed by the provision of a high-frequency electric source for generating plasma, if necessary.

A representative thermal CVD method executed by using the thin-film producing apparatuses 8A to 8D will be discussed with reference to FIG. 2.

The thin-film producing apparatus 8A comprises the aluminum-alloy chamber 20 in which the table 10 providing a heater 22 therein is installed. The shower head portion 24 made of aluminum alloy is installed to a ceiling portion oppositely facing with the table 10. A gas supply port 24a of the shower head portion 24 is connected to the gas supply line 16. A plurality of gas outlet ports 26 are provided at a bottom portion of the chamber 20 and are connected to the gas evacuating line 18. The clamp ring 28 made of AlN (aluminum nitride) is provided around the table 10 so as to fix a wafer 50 on the table 10. A ring-shaped attachment ring 30 is provided around the clamp ring 28, as shown in FIG. 2.

When a thin film of Ti or W is produced on the wafer 50 by using the above-mentioned thin-film producing apparatus 8A, the thin film is also produced on the inner wall of the chamber 20, exposed portions of the table 10, the clamp ring 28, the attachment ring 30 as an unnecessary film causing particles. The exposed portions of the table 10 are exposed to the cleaning gas. Therefore, it is necessary to execute a cleaning treatment for removing the unnecessary film attached on various portions at regular intervals or irregular intervals.

The examples 1 to 36 are employed in this cleaning method as a cleaning gas. If the examples 26 to 36 shown in Table 4 are employed as a cleaning gas, a mixed gas of HF gas (flow rate: 1000 SCCM) and $N_2O$ gas (flow rate: 10 SCCM) is used and the pressure is set at about 500 Torr. The cleaning temperature is set at about 500° C. within a range of 450 to 600° C.

In this condition, the etching speed of the cleaning gas with respect to TiN is about 4000 Å/min although this high speed is not shown in Table 4. This speed is generally the same as that in a case that the cleaning executed by means of $ClF_3$ gas at the temperature ranging from 200 to 300° C. Further, if $ClF_3$ gas is used at the high temperature 500° C., the table 10, the shower head 24, the clamp ring 28 and the attachment ring 30 will be corroded. In contrast, by using the cleaning gas according to the present invention, even at the temperature of 500° C., the corrosion of the various portions in the chamber 20 is prevented. That is, the film producing process is generally executed at the temperature ranging from 600 to 700° C., and the conventional cleaning process was generally executed at a temperature ranging from 200 to 300° C. In contrast, the cleaning process using the cleaning gas according to the present invention can be executed at the temperature ranging from 450 to 600° C. Therefore, the difference between the temperature in the film producing process and the temperature in the cleaning process is largely decreased by employing the cleaning gas according to the present invention. This enables the idling time for varying the temperature to be largely decreased. Consequently, this improves a throughput of the apparatus 2. Further, it will be understood that cleaning an inner surface of the piping of the gas evacuating line is simultaneously executed with this cleaning of the chamber 20.

Herein, the cleaning gas may be diluted by mixing inert gas such as Ar, $N_2$ and He. Further, the cleaning may be executed at predetermined intervals. More specifically, it may be executed at each time when a predetermined number of the wafers were processed, or at each time when an accumulated time period for producing film reached a predetermined time period, or at regular intervals.

Furthermore, an after-treatment of the cleaning process may be executed by evacuating the cleaning gas from the chamber 20 and repeatedly supplying and stopping supplying inert gas such as $N_2$ gas to the chamber 20, under a condition that the supply of the cleaning gas is stopped. If the repeated supply and stop of the inert gas are executed several times while evacuating gases from the chamber 20, the cleaning gas will be rapidly discharged from the chamber 20.

Additionally, the gas supply port 24a of the shower head portion 24 may be divided into two ports which are connected to a cleaning gas supply line and a film-producing gas supply line, respectively. If such an arrangement of the plural supply ports 24a is employed, inert gas such as $N_2$ gas is flowed in the film-producing gas supply line during the cleaning process. This prevents the cleaning gas from inversely flowing to and remaining in the film-producing gas supply line. Accordingly, the affect of the remaining cleaning gas to the next film producing process is prevented.

Furthermore, although the explanation of the cleaning process is discussed as to the film producing apparatus 8A, it will be understood that the other film producing apparatuses 8B to 8D may execute the normal film forming process during the cleaning process of the film producing apparatus 8A or may independently execute the cleaning process.

Although the embodiment of the cleaning method has been shown and described such that only the film producing apparatus 8A executes the cleaning process, it will be understood that several or all of the film producing apparatuses 8A to 8D may simultaneously execute the cleaning process together with the common conveying chamber 4. In this case, the pressures of the respective chambers are equalized at the same pressure by supplying inert gas before the cleaning. Thereafter, the corresponding gate valves are opened, and the cleaning gas is supplied to the respective gas supply line 16. Furthermore, simultaneously with this supply, the evacuation through the respective gas evacuating lines 18 is executed. This enables the several chambers to be simultaneously cleaned by the cleaning process.

Furthermore, in such a situation, the spare chambers 12A and 12B and the cassette chambers 14A and 14B may be simultaneously cleaned by this cleaning process.

Although the cleaning gas and method according to the present invention has been shown and described such that the cleaning gas is independently supplied to the film producing apparatus, the common conveying chamber, the spare chamber and the cassette chamber, it will be understood that the present invention is not limited to this embodied method and may be supplied to each of several blocks constituted by several chambers. This enables the number of the gas supply lines to be decreased. Furthermore, if it is arranged such that all of the chambers are simultaneously executed, it is possible to decrease the number of the gas supply lines to one.

Although the embodied cleaning gas and method according to the present invention has been mainly shown and described as to the removal of the thin film of Ti, W, compound thereof and alloy thereof, it will be understood that the invention is not limited to these and may be applicable to the removal of the thin film of Ta, Ru, Ir, the compound thereof and the alloy thereof.

Further, although the embodied cleaning gas and method according to the present invention has been shown and described to employ the CVD method, the invention is not limited to this and may be applied to a vacuum treatment apparatus which generates the above mentioned compound and alloy in a treatment chamber due to a main treatment. Furthermore, although the embodied cleaning method according to the present invention has been shown and described as to the apparatus for treating a semiconductor wafer, the invention is not limited to this and may be applied to an apparatus treating a LCD substrate or glass substrate.

With the cleaning gas and the cleaning method of a vacuum treatment apparatus in accordance with the present invention, it becomes possible to ensure superior advantages. More specifically, by employing the cleaning gas according to the present invention to clean the vacuum treatment apparatus, it becomes possible to remove an unnecessary film deposited in the vacuum treatment apparatus, which produces a thin film of Ti, W, Ta, Ru, Ir, the compound thereof and the alloy thereof, at a relatively high temperature near the film producing temperature and at high etching speed and to prevent the apparatus from being damaged by corrosion. Therefore, it is possible to decrease a difference between the temperatures in film producing process and in cleaning process. This enables the idling time for varying the temperature to be decreased. Consequently, it is possible to remarkably improve an yield factor of products and a throughput of the producing apparatus employing the cleaning gas and the method using the gas according to the present invention.

The entire disclosure of Japanese Patent Application No. 11-302715 filed on Nov. 24, 1999 including specification, claims, drawings and summary are incorporated herein by reference in its entirety.

What is claimed is:

1. A method for removing a deposited material from inside surfaces of a vacuum treatment apparatus for forming a thin film of one of Ti, W, Ta, Ru and Ir, a compound including one of Ti, W, Ta, Ru and Ir or an alloy including one of Ti, W, Ta, Ru and Ir, said method comprising flowing a cleaning gas in a vacuum chamber, wherein the cleaning gas comprises HF gas and oxygen containing gas, a concentration of the HF gas is greater than or equal to 1 vol %, and a concentration of said oxygen containing gas ranges from 0.5 to 99 vol %, and a sum of a partial pressure of the HF as and partial pressure of the oxygen containing gas during the cleaning gas flowing is smaller than or equal to 500 Torr.

2. A method according to claim 1, further comprising evacuating the cleaning gas flowed in the vacuum treatment apparatus.

3. A method according to claim 1, wherein said oxygen containing gas includes at least one of $O_2$ gas, $O_3$ gas, $N_2O$ gas, NO gas, CO gas or $CO_2$ gas.

4. A method according to claim 1, wherein a temperature in the vacuum treatment apparatus is kept within a range of 450 to 600° C. when the cleaning is executed.

5. A method according to claim 1, wherein the vacuum treatment apparatus includes a plurality of vacuum treatment apparatuses which are connected to a common conveying chamber, the plurality of the vacuum treatment apparatuses and the common conveying chamber are selectively cleaned by flowing the cleaning gas.

6. A method according to claim 1, wherein the vacuum treatment apparatus includes a plurality of vacuum treatment apparatuses which are connected to a common conveying chamber, the plurality of the vacuum treatment apparatuses and the common conveying chamber are simultaneously cleaned by flowing the cleaning gas.

7. A method according to claim 1, wherein the sum of the partial pressure of the HF gas and the partial pressure of the oxygen containing gas during the cleaning gas flowing is smaller than or equal to 100 Torr.

8. A method according to claim 1, wherein the sum of the partial pressure of the HF gas and the partial pressure of the oxygen containing gas during the cleaning gas flowing is within a range of 0.1 to 10 Torr.

9. A method according to claim 1, wherein the concentration of the HF gas is greater than or equal to 10 vol %, and the concentration of the oxygen containing gas is within a range from 1 to 90 vol %.

10. A method according to claim 1, further comprising:
stopping the flowing of the cleaning gas;
flowing an inert gas in the chamber while evacuating gases in the chamber; and
stopping the flowing of the inert gas and evacuating the gases.

11. A method according to claim 1, further comprising flowing an inactive gas into the chamber for a predetermined time period while evacuating gases in the chamber.

* * * * *